United States Patent
Chen et al.

(10) Patent No.: US 7,781,152 B2
(45) Date of Patent: Aug. 24, 2010

(54) OZONE-ASSISTED LITHOGRAPHY PROCESS WITH IMAGE ENHANCEMENT FOR CPP HEAD MANUFACTURING

(75) Inventors: Chao-Peng Chen, Fremont, CA (US); Rina Kaji, Tokyo (JP); Jei-Wei Chang, Cupertino, CA (US)

(73) Assignee: Headway Technologies, Inc., Milpitas, CA (US)

( * ) Notice: Subject to any disclaimer, the term of this patent is extended or adjusted under 35 U.S.C. 154(b) by 934 days.

(21) Appl. No.: 10/900,942

(22) Filed: Jul. 28, 2004

(65) Prior Publication Data

US 2006/0024618 A1  Feb. 2, 2006

(51) Int. Cl.
*G03F 7/00* (2006.01)
(52) U.S. Cl. .............. 430/312; 430/313; 430/394; 430/346
(58) Field of Classification Search ............... None
See application file for complete search history.

(56) References Cited

U.S. PATENT DOCUMENTS

| | | | |
|---|---|---|---|
| 5,883,763 A * | 3/1999 | Yuan et al. ............ | 360/324 |
| 6,218,056 B1 * | 4/2001 | Pinarbasi et al. ......... | 430/5 |
| 6,493,926 B2 | 12/2002 | Han et al. ............. | 29/603.14 |
| 6,582,525 B2 * | 6/2003 | Bergman ............... | 134/2 |
| 2002/0055017 A1 | 5/2002 | Fukushima et al. ... | 428/694 SG |
| 2002/0058197 A1 * | 5/2002 | Nozaki et al. ........ | 430/270.1 |
| 2004/0109263 A1 * | 6/2004 | Suda et al. ........... | 360/322 |

OTHER PUBLICATIONS

Co-pending U.S. Patent HTIRC-03-011, filed Apr. 20, 2004, U.S. Appl. No. 10/827,949, "Ozone-Assisted Bi-Layer Lift-Off Stencil for Narrow Track CPP-GMR Heads," assigned to the same assignee.

* cited by examiner

*Primary Examiner*—Daborah Chacko Davis
(74) *Attorney, Agent, or Firm*—Saile Ackerman LLC; Stephen B. Ackerman

(57) ABSTRACT

A method for forming a bi-layer lift-off mask, including a hardened photoresistive stencil layer on a PMGI layer, for use in fabricating GMR read-head sensors with trackwidths of less than 0.1 microns and TMJ MRAM devices of similar critical dimensions. The stencil portion of the mask includes a narrow portion with sharply defined edge and corners which are formed, without rounding or extreme undercut, by a photolithographic process which includes the formation, in a first development process, of auxiliary pattern pieces over the corners of the stencil and a subsequent oxidation in ozone for removing those auxiliary pattern pieces and obtaining sharply defined edge and corners and a controlled dissolution of the PMGI layer.

13 Claims, 4 Drawing Sheets

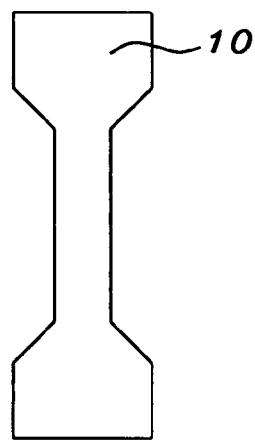
*FIG. 1a — Prior Art*
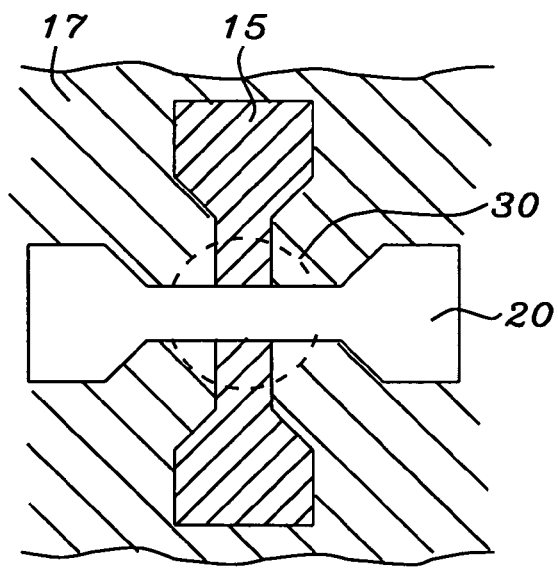
*FIG. 1b — Prior Art*
| 1 | 2 | 1 |
|---|---|---|
| 3 |   | 3 |
| 1 | 2 | 1 |
*FIG. 1c*

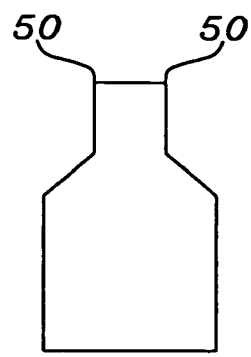
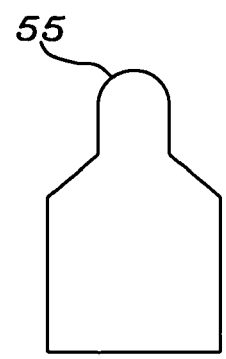
FIG. 2a    FIG. 2b – Prior Art
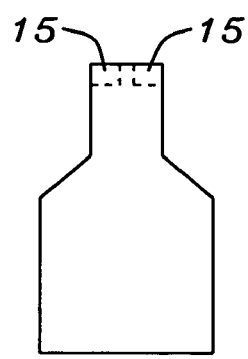
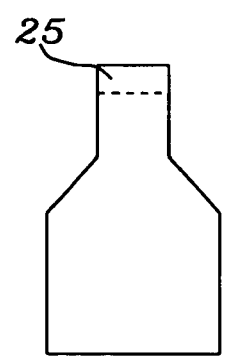
FIG. 3a    FIG. 3b
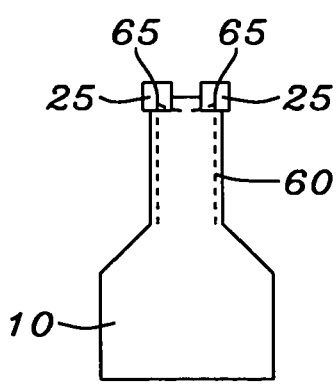
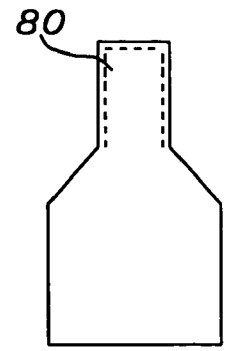
FIG. 4a    FIG. 4b

OZONE-ASSISTED LITHOGRAPHY PROCESS WITH IMAGE ENHANCEMENT FOR CPP HEAD MANUFACTURING

RELATED PATENT APPLICATION

The present application is related to filing date Apr. 20, 2004, Ser. No. 10/827,949, which is assigned to the same assignee as the present application.

BACKGROUND OF THE INVENTION

1. Field of the Invention

This invention relates generally to the fabrication of a giant magnetoresistive (GMR) magnetic field sensor in the current-perpendicular-to-plane (CPP) configuration, more specifically to a method of improving photolithographic masks used in the patterning of such devices.

2. Description of the Related Art

Magnetic read sensors that utilize the giant magnetoresistive (GMR) effect for their operation must be patterned to produce a required trackwidth. Such patterning is conventionally done using a single photolithographic lift-off mask as both an etching stencil and a deposition mask. The shape of the stencil portion of such a mask permits the necessary trimming of the deposited layers to the required trackwidth and then the mask is used to allow deposition of additional layers (eg. conduction lead layers, biasing layers and/or insulation layers) within the removed regions.

In current head fabrication technology, the track width and back edge of a read sensor, such as a CPP read sensor, are defined by two successive photolithographic processes. Referring to FIG. 1a, there is shown an overhead view of a first lithographic mask (10), which has a kind of "dog-bone" shape, formed on the surface of a sensor stack. When the all portions of the stack extending beyond the periphery of the mask are removed by etching, the removed portions are typically refilled with some other material (eg. dielectric material). The patterned (15) and refilled (17) configuration is now shown in FIG. 1b, where the narrow central portion (circled (30)) defines the track width of the device. At this point a second mask (20), substantially identical to the first but oriented orthogonally to the first mask, is formed over the configuration. When an etch and refill is performed using this mask, the final definition of the device is obtained, both in terms of its track width and its back edge. Unfortunately, this double masking operation becomes impractical as the dimensions of the device fall below 100 nm. As is shown in FIG. 1c, the procedure produces uneven depths in the deposited dielectric (or other) materials in the areas indicated as 1, 2 and 3. This, in turn, can result in shorting to the overlaid top lead layer.

One way to overcome this problem is to combine the two step process into a single step by the use of a mask shaped as shown in FIG. 2a. Unfortunately, due to insufficient photoexposure dosage at the corners (50) of such a mask shape, the sharp corners become poorly defined and the mask is actually produced with the rounded corners (55) shown in FIG. 2b.

To avoid such rounded corners, one can apply enhanced photoexposure to the corner areas, as shown by the outlined regions (15) in FIG. 3a. When the photoresist forming the upper portion of the mask is developed, however, the overexposed regions are much more resistant to dissolution than the layer of material (eg. PMGI (polydimethylglutarimide)) beneath the photoresist, and that overexposed portion of the mask becomes suspended, with nothing beneath it (region (25) in FIG. 3b). To avoid this problem, a method has been developed which allows the dissolution of the mask underlayer to be controlled, so that the sharp corner and edge details can be defined and developed and be supported by an underlayer.

It is noted that the inability to control the dissolution of a bi-layer mask underlayer causes significant problems not only, as in the present case, when the mask has sharp edges and corners, but also when the mask has a thin central portion. That problem has been addressed Han et al. (U.S. Pat. No. 6,493,926), which is assigned to the same assignee as the present invention and which is fully incorporated herein by reference. Han discusses several problems associated with prior art lift-off masks in which an upper (stencil) layer of photoresist is formed over a lower, undercut, pedestal, layer. In such mask designs the width of the pedestal layer becomes a critical factor in the proper performance of the mask during the deposition stage. If the pedestal is undercut too much, the upper portion of the mask can collapse prematurely under the weight of deposition residue making a clean lift-off of the mask impossible. On the other hand, if the pedestal is insufficiently undercut, subsequent depositions can build up against the pedestal, called "fencing," leading to excessive thicknesses of the deposited material and short-circuiting of deposited conductive layers. To overcome the difficulties of forming properly and consistently undercut pedestals and for use in forming trackwidths of approximately 0.5 microns, Han et al. teach the formation of a bi-layer suspension-bridge mask formation, in which there is no pedestal directly beneath the upper portion of the mask, but wherein the upper portion is supported on two pedestals that are laterally disposed beneath two distal ends of the mask. The complete elimination of any support directly beneath the mask thereby avoids the problems associated with insufficient or overly-sufficient pedestal undercut. The formation taught by Han et al. requires that the portion of the mask that would ordinarily be beneath the upper portion be completely removed, so that the upper portion is suspended above the device to be patterned and does not contact it. This object is achieved by forming the pedestal portion of the mask of a layer of PMGI, while forming the upper portion of the mask of a layer of photoresist material. Application of a proper developing solution thereupon dissolves the lower PMGI portion preferentially relative to the photoresist upper portion, removing the PMGI except beneath the end portions where it remains to serve as a support.

Whereas the method of Han et al. eliminates the problem of inadequately controlled PMGI dissolution by essentially completely dissolving the PMGI, to form a completely suspended region, such complete suspension in the present case exacerbates the problem. The present inventors, in related Application HTIRC-03-011, which is fully incorporated herein by reference, have applied a novel ozone-assisted method of developing a mask of the type discussed by Han, so that a thin central region of the mask can be formed with a thin undercut PMGI region rather than having to remove the PMGI underlayer completely. While the present invention relates to a differently shaped mask, with development problems unlike those associated with the formation of a narrow central mask region, ozone can still be applied advantageously to control underlayer dissolution. It is the purpose of the present invention, therefore, to teach a method of forming a bilayer lift-off mask having sharply defined edge and corner regions, wherein the method includes the use of ozone to assist in the controlled dissolution of a mask underlayer.

SUMMARY OF THE INVENTION

The first object of this invention is to provide a method of forming a photolithographic bilayer lift-off mask having sharply defined edge and corner regions of sub-100 nm critical dimension.

A second object of this invention is to use the mask so formed to pattern a GMR stack having a CPP (current-perpendicular-to-plane) configuration, but other configurations such as a tunneling magnetoresistive (TMR) sensor or a magnetic random access memory (MRAM) can also be effectively patterned.

In accord with the object of this invention there is provided a bi-layer lift-off mask and a method of forming the mask on a substrate which is preferably a GMR stack. The upper layer of the mask (the stencil or image-forming layer) has, in an overhead perspective, a narrow extending portion with sharply defined edges and corners, yet the exposure and development of the mask retains the edge and corner definition without rounding and without the loss of a supporting underlayer. The upper layer of the bi-layer structure is formed of a photoresist material (or a material which can be exposed by appropriate radiation and developed) and the lower layer is formed of a PMGI polymer. The corner regions of the mask, which in prior art formation were subject to either elimination by rounding off or to formation with no underlayer support, are now augmented by auxiliary pattern pieces as shown in FIG. 4a. Referring to FIG. 4a, there is seen, in a schematic overhead view, the primary stencil mask (10), with two auxiliary pattern pieces formed on its corners (35). The auxiliary pattern pieces are formed by differentially exposing the patterned portions of the upper layer relative to the primary mask, as will be discussed below. A first development process, using TMAH (tetramethyl ammonium hydroxide) developing solution, undercuts the lower PMGI layer as shown in dashed outline (60). The TMAH, if used by itself, dissolves the PMGI too rapidly to be used to form the mask in its final form. It is during this TMAH part of the process that the auxiliary pattern pieces prevent excessive undercutting of the PMGI at the corner regions (65). A second, ozone oxidation process, the results of which are shown in FIG. 4b, removes the auxiliary pattern pieces, that have already performed their part of the process, and controllably forms the defined pattern edges and corners (shown encircled). The dashed outline (80) shows the periphery of the controllably undercut underlayer, which now provides adequate support for the edge and corner regions of the upper mask portion. The differential etching of the lower layer is therefore accomplished by a novel method combining the use of selected organic photoresistive materials for the mask layers, an initial dissolution of the lower mask layer by an organic solvent, such as a 1.79% solution of TMAH, followed by a precisely controlled ozone oxidation process (without the TMAH) at an elevated processing temperature to create the final shape. It is noted that the use of TMAH alone produces an etch rate that is too high for the controlled thinning necessary to produce the ridge. On the other hand, using anisotropic plasma etches, such as oxygen plasma etches, to remove the lower layer, would damage the upper layer of the mask. Thus, the combination of the initial use of TMAH alone, and the subsequent ozone oxidation produces the required control of the etch process that allows the objects of the invention to be achieved.

Once the etch is completed, the mask is then used to pattern the GMR stack on which it is formed by, preferentially, using an ion-beam etch to remove portions of the GMR stack extending beyond the periphery of the mask down to a predetermined depth of the stack and then depositing an appropriate dielectric (or other) layer within the region of stack removal.

BRIEF DESCRIPTION OF THE DRAWINGS

The objects, features and advantages of the present invention are understood within the context of the Description of the Preferred Embodiments, as set forth below. The Description of the Preferred Embodiments is understood within the context of the accompanying figure, wherein:

FIGS. 1a-c are schematic overhead views of a dual-mask method of prior-art patterning and regions of poor pattern definition.

FIGS. 2a and b are schematic overhead views of a single mask that can replace the dual-mask process and of the inadequate formation of the mask using prior art methods.

FIGS. 3a and b are schematic overhead views of poor mask formation using another prior art method.

FIGS. 4a and b show particular steps of the mask formation of the present invention.

DESCRIPTION OF THE PREFERRED EMBODIMENTS

The present invention provides a method of forming and using a photolithographic bi-layer lift-off mask of sub-100 nm (less than 0.1 microns) critical dimensions, having sharply defined edges and corner regions. The mask has an upper, stencil portion formed of a photoresistive material, which is commercially available NEB22A2 in this embodiment but which could be an alternative material that is sensitive to other forms of exposing radiation. The mask has a lower, undercut portion, formed of PMGI. The edge and corner regions of the mask are formed and shaped by a process that involves adding auxiliary pattern pieces to the corners, which prevent excessive undercutting of the PMGI during a first development process, then removing those auxiliary pieces and completing the formation of the stencil and PMGI layers using a process of ozone oxidation. The auxiliary pattern pieces are added by differentially exposing regions of the photoresist, so that the desired auxiliary pieces are formed as a result of their having different dissolution properties in the developing solution.

Figure 5A:
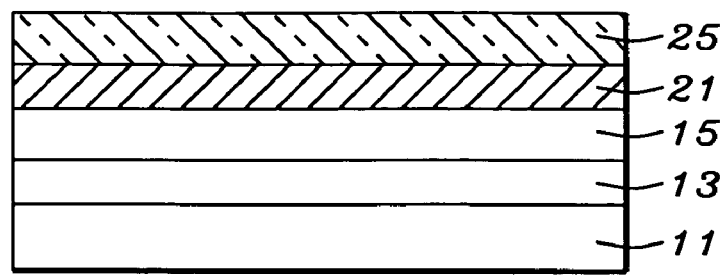
FIGS. 5a-d show, schematically, the steps used in forming the mask on a substrate.

Referring first to FIG. 5a, there is shown, in schematic vertical cross-section, a GMR stack substrate, which is preferably a multilayer CPP (current perpendicular to plane) configuration which includes a pinned layer (11), a spacer layer (13) and a free layer (15). This substrate will be patterned by the mask of the present invention.

A layer of PMGI (21) is formed on the substrate to a thickness between approximately 0.03 and 0.1 microns, with approximately 0.05 microns being preferred. A layer of photoresistive material (25) is formed on the PMGI layer, the layer in this embodiment being a layer of commercially available NEB22A2 (an e-beam resist) which is formed to a thickness between approximately 0.1 and 2.0 microns with approximately 0.2 microns being preferred. The materials appropriate for forming this upper layer include both positive and negative tone deep-ultraviolet (DUV) resists, e-beam resists (including, but not limited to NEB22A2) and X-ray resists.

Figure 5B:
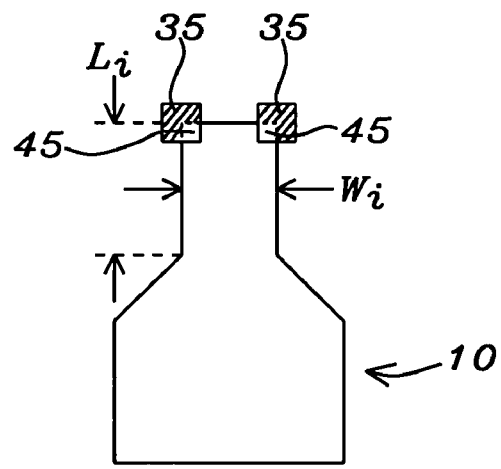

Referring next to FIG. 5b, there is shown in schematic overhead view the shape of the stencil to be formed by exposure of the upper layer of the photoresistive material. The overall shape includes a main stencil portion (the first portion) (10) having an initial width, $W_i$, which is between approximately 0.1 and 0.5 microns and an initial length, $L_i$ between approximately 0.5 and 2.0 microns, both of which will ultimately be reduced by the development process to final width and length, $W_f$ and $L_f$. The final width, $W_f$ (shown in FIG. 5d), which is the critical dimension achieved by the invention, is the desired track width of the GMR device to be formed from the GMR substrate. This final width is below 100 nm (0.1 microns).

In accord with the objects and method of the present invention, auxiliary patterns (a second pattern portion) are defined on the corners of the mask (35). These auxiliary patterns are approximately box-like in shape (substantially rectangular) and overlap a portion of each corner of the primary stencil pattern, or first pattern portion (45). The auxiliary patterns range in their side dimensions from approximately 0.05 to 0.2 microns and the region of overlap ranges in size from approximately 0.01 to 0.1 microns. In the pattern of this preferred embodiment, the initial width, $W_i$, is approximately 0.16 microns and the auxiliary pattern is approximately 0.06 microns×0.06 microns. The second or auxiliary pattern portion, when exposed and developed, will form auxiliary pieces on the corners of the developed first pattern portion. An enlarged corner of the pattern is shown circled.

The exposure of the overall pattern is different in the second pattern portion than in the first pattern portion. First, the first pattern portion (10), which will become the final stencil, is uniformly exposed with a first e-beam dose of between 10 and 30 μC/cm$^2$ (microcoulombs/square cm), but 23 μC/cm$^2$ is preferred. After this first exposure, the auxiliary pattern is then exposed with a second e-beam dose of between approximately 5 and 30 μC/cm$^2$, but approximately 12 μC/cm$^2$ is preferred. The region of overlap (45) thereby receives a total exposure which is the sum of the first and second e-beam doses. The non-overlapping portion of the auxiliary pattern (shown shaded) beyond the overlap region receives only the lesser second e-beam dose. The lesser exposure of the non-overlapping portion of the auxiliary pattern will render its subsequent removal easier. After exposure, the system is subjected to a post-exposure bake at 100° C. for approximately 2 minutes to promote the molecular linkages within the resistive medium which hardens it and makes it resistant to dissolution.

Figure 5C:
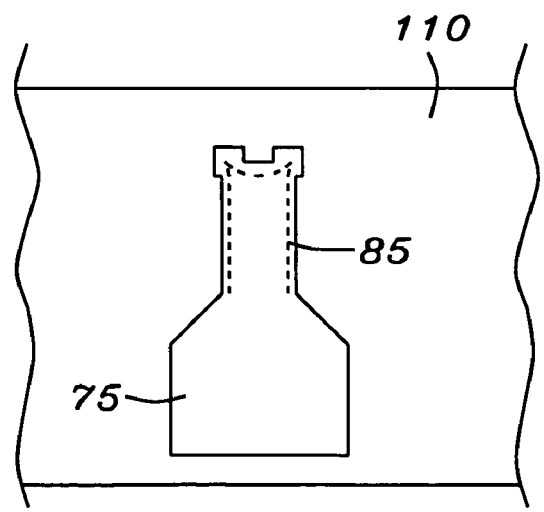

Referring now to FIG. 5c, there is shown the mask which has been formed from the exposed pattern of FIG. 5b subsequent to a first development process which is done in a solution of approximately 1.79% TMAH, but which could be as much as 2.38% TMAH. The development process lasts for approximately 13 seconds, but could be between approximately 10 and 60 seconds. As is shown in the figure, the both the photoresist and PMGI covering the substrate are removed peripherally from the exposed and postbaked region (75) and the PMGI is undercut relative to the upper photoresist layer as schematically indicated by the dashed outline (85). The exposed second pattern portion has now formed auxiliary pattern pieces (35) which still remain on the stencil portion of the mask. The upper surface of the substrate (110) is shown in the region from which the photoresist and PMGI have been removed.

Figure 5D:
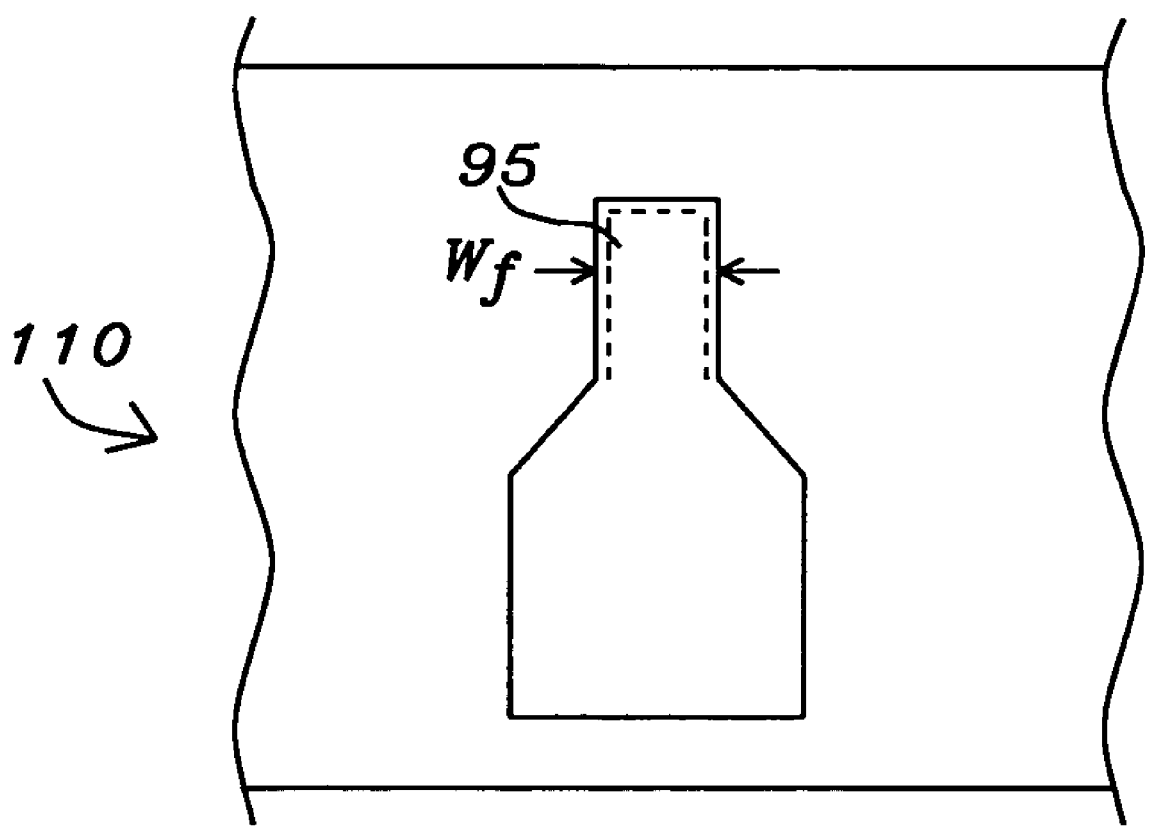

Referring to FIG. 5d, there is shown the formation of FIG. 5c subsequent to the second part of the development process in which the formation of FIG. 5c is subjected to an oxidation by ozone in an oxidation chamber. The oxidation chamber temperature may range between approximately 60° and 130° C., but 80° C., for approximately 5 minutes is preferred. The ozone flow rate is between 5 and 30 L/min (liters/min.) with ozone concentration ranges between approximately 5 and 300 g/m$^3$. The ozone oxidation process removes the auxiliary pattern pieces, shrinks the stencil portion of the mask to its final width and renders the PMGI undercut uniform, as shown by the dashed outline (95). The mask now has the desired, but otherwise unobtainable, shape of the mask of FIG. 2a and the final width $W_f$.

At this point the mask fabrication is complete and the mask can be used as an etching stencil and deposition mask. To form a CPP read sensor, the substrate is etched by an ion-beam etch in the region exterior to the stencil periphery (110), the etch removing all layers of the sensor stack down to the upper surface of the spacer layer. The sharply defined edge and corner regions of the mask permit a correspondingly precise etch of the sensor trackwidth. A layer of $Al_2O_3$ insulating material is then deposited by ion-beam deposition over the exposed spacer surface and the mask is lifted off. The actual details of the etch and subsequent deposition process used to form the CPP sensor is not a part of the present invention and will not be discussed further as they are well known in the prior art.

As is understood by a person skilled in the art, the preferred embodiment of the present invention is illustrative of the present invention rather than limiting of the present invention. Revisions and modifications may be made to methods, materials, structures and dimensions employed in fabricating a bi-layer lift-off mask with sharply defined edge and corner regions of sub-100 nm critical dimension which can be used for patterning a GMR read head of CPP configuration, while still providing a method for fabricating a a bi-layer lift-off mask with sharply defined edge and corner regions of sub-100 nm critical dimension which can be used for patterning a GMR read head of CPP configuration in accord with the spirit and scope of the present invention as defined by the appended claims.

What is claimed is:

1. A method for forming, on a substrate, a bi-layer lift-off mask having a stencil layer with a projecting region having sharply defined edge and corner regions with sub-100 nm dimensions, comprising:

providing a substrate;

forming on said substrate a lower layer of PMGI or its derivatives;

forming on said PMGI layer an upper layer of radiation sensitive resist material;

exposing a first pattern portion of said upper layer of radiation sensitive resist material with a first dose of radiation, said first pattern portion having a narrow projecting region with parallel lateral edges terminating in a terminal transverse edge at two corner regions and an initial width $W_i$; and exposing a second pattern portion of said upper layer of radiation sensitive material with a second dose of radiation, said second pattern portion including an auxiliary pattern portion that partially overlaps said corner regions of said first pattern portion and which protects said corner region during subsequent processing and, when subsequently removed, will leave said corner regions sharply defined and with no supporting PMGI layer remaining beneath them; then developing said exposed first and second pattern portions of said upper layer, said developing process removing all unexposed portions of said upper layer as well as at least all portions of said lower PMGI layer not directly beneath said exposed upper layer and producing, thereby, an upper stencil shape including said first pattern portion with said auxiliary pattern pieces corresponding to said second pattern portion formed thereon and wherein there is an initial undercut of said PMGI layer relative to said upper layer producing a partial suspension of said upper layer; then performing an ozone oxidation process of said developed first and second pattern portions of said upper layer and said lower PMGI layer by placing said layers in the presence of an ozone oxidizing ambient within an oxidizing chamber wherein there is an ozone density, an ozone flow rate, an ozone oxidation processing time and a processing temperature, said ozone oxidation process, thereby, removing said auxiliary pattern pieces, forming and leaving behind sharply defined edge and corners on said first pattern portion of said stencil shape, reducing said stencil shape to a final width, $W_f$, and producing a further controlled and uniform final undercut of the PMGI layer by a controlled rate of dissolution whereby said first pattern portion projects out over a substrate and is supported by a uniformly undercut lower layer.

2. The method of claim 1 wherein said radiation sensitive material includes materials that are sensitive to exposure by e-beam, materials sensitive to X-ray or materials sensitive to deep ultraviolet radiation.

3. The method of claim 2 wherein said radiation is e-beam radiation and the radiation sensitive material is sensitive to e-beam radiation.

4. The method of claim 1 wherein the initial width, $W_i$, of said first pattern portion is between approximately 0.1 and 0.5 microns, the dimension of said second pattern portion is between approximately 0.05 and 0.2 microns on a side and the dimension of the region of overlap between said first pattern portion and said auxiliary pattern pieces is between approximately 0.01 to 0.1 microns.

5. The method of claim 1 wherein the final width, $W_f$, of the stencil is less than 0.1 microns.

6. The method of claim 3 wherein said e-beam radiation is applied to said first pattern portion with a dose rate between approximately 10 and 30 $\mu C/cm^2$ and is applied to said second pattern portion with a dose rate between approximately 5 and 30 $\mu C/cm^2$.

7. The method of claim 1 wherein said developing process includes a post-bake of said exposed first and second pattern portions of said upper layer at approximately 100° C. for approximately 2 minutes after the application of a developing solution having a concentration of up to 2.38% TMAH for a time between approximately 10 and 60 seconds to remove all said unexposed portions of said upper layer as well as at least all said portions of said lower PMGI layer not directly beneath said exposed upper layer.

8. The method of claim 1 wherein the ozone flow rate is between 5 and 30 L/min (liters/min.) with ozone concentration ranges between approximately 5 and 300 $g/m^3$.

9. The method of claim 1 wherein said oxidation process time is between approximately 1 and 30 minutes.

10. The method of claim 1 wherein said oxidation process temperature is between approximately 60° and 130° C.

11. The method of claim 1 wherein the thickness of said upper layer is between approximately 0.1 and 2.0 microns.

12. The method of claim 1 wherein the thickness of said PMGI layer is between approximately 0.03 and 0.1 microns.

13. The method of claim 1 wherein said substrate is a GMR stack in a CPP, CIP or MRAM TMJ configuration and wherein said bi-layer lift-off mask is used to pattern said stack.

* * * * *

UNITED STATES PATENT AND TRADEMARK OFFICE
CERTIFICATE OF CORRECTION

PATENT NO. : 7,781,152 B2  
APPLICATION NO. : 10/900942  
DATED : August 24, 2010  
INVENTOR(S) : Chao-Peng Chen et al.

It is certified that error appears in the above-identified patent and that said Letters Patent is hereby corrected as shown below:

On the Title Page
In the ASSIGNEE: (73), add second Assignee -- TDK Corporation, Tokyo, Japan --

Signed and Sealed this
Twenty-ninth Day of March, 2011

David J. Kappos
*Director of the United States Patent and Trademark Office*